(12) United States Patent
Grassl et al.

(10) Patent No.: US 7,019,241 B2
(45) Date of Patent: Mar. 28, 2006

(54) ENERGY-AUTONOMOUS ELECTROMECHANICAL WIRELESS SWITCH

(75) Inventors: Erwin Grassl, St. Heinrich (DE); Frank Schmidt, Zorneding (DE)

(73) Assignee: Enocean GmbH, Oberhaching (DE)

( * ) Notice: Subject to any disclaimer, the term of this patent is extended or adjusted under 35 U.S.C. 154(b) by 0 days.

(21) Appl. No.: 11/098,945

(22) Filed: Apr. 4, 2005

(65) Prior Publication Data

US 2005/0275581 A1    Dec. 15, 2005

Related U.S. Application Data

(63) Continuation of application No. PCT/DE03/03124, filed on Sep. 19, 2003.

(30) Foreign Application Priority Data

Oct. 4, 2002   (DE)   ................ 102 46 342
Dec. 2, 2002   (DE)   ................ 102 56 156

(51) Int. Cl.
*H01H 13/00*   (2006.01)
*H01H 3/00*    (2006.01)

(52) U.S. Cl. ............ 200/339; 200/553; 200/402

(58) Field of Classification Search ........... 200/339, 200/16 R, 16 F, 402, 430–440, 553, 537
See application file for complete search history.

(56) References Cited

U.S. PATENT DOCUMENTS

| | | | | |
|---|---|---|---|---|
| 5,446,253 A | * | 8/1995 | Oshgan | ............ 200/556 |
| 5,486,669 A | * | 1/1996 | Oshgan | ............ 200/556 |
| 5,844,516 A | | 12/1998 | Viljanen | |
| 6,448,880 B1 | * | 9/2002 | Yu | ............ 337/66 |
| 6,797,905 B1 | * | 9/2004 | Wang et al. | ............ 200/339 |

FOREIGN PATENT DOCUMENTS

| | | |
|---|---|---|
| DE | 297 12 270 U | 11/1997 |
| DE | 100 63 305 C1 | 9/2001 |
| DE | 100 25 561 A | 12/2001 |
| EP | 0 656 612 A1 | 11/1994 |
| EP | 1 306 817 A1 | 10/2002 |
| WO | WO 01/67580 A | 9/2001 |

* cited by examiner

*Primary Examiner*—Kyung Lee
(74) *Attorney, Agent, or Firm*—Cohen, Pontani, Lieberman & Pavane

(57) ABSTRACT

An energy-autonomous electromechanical wireless switch which has at least one transducer element for converting mechanical to electrical energy, and has at least one actuating panel for introducing the mechanical energy, and has at least one sensor for each actuating panel for detecting the switching command. At least one electronic system generates and emits a wireless signal. At least one mechanism deflects the forces introduced by the actuating panel onto the transducer element.

13 Claims, 3 Drawing Sheets

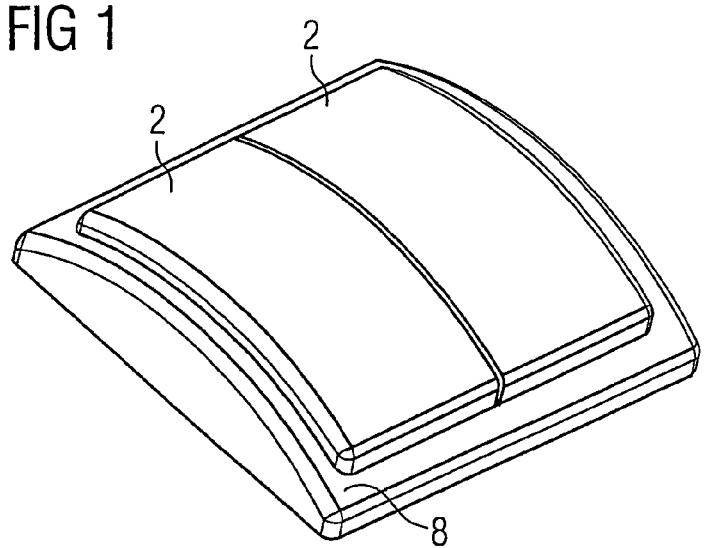
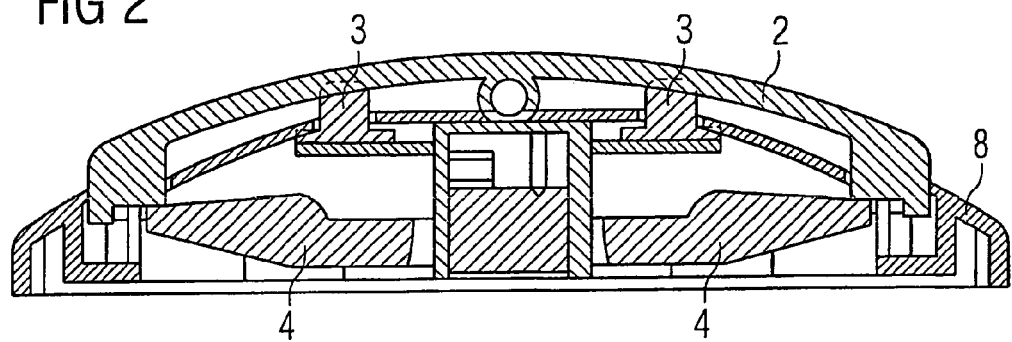

ENERGY-AUTONOMOUS ELECTROMECHANICAL WIRELESS SWITCH

RELATED APPLICATIONS

This is a continuation of International Application No. PCT/DE2003/003124, filed on Sep. 19, 2003, which claims priority from German Patent Application Nos. 102 46 342.5 and 102 56 156.7, filed Oct. 4, 2002 and Dec. 2, 2002, respectively, the content of which is hereby incorporated by reference.

FIELD OF THE INVENTION

The invention relates to an energy-autonomous electromechanical wireless switch, for example used as a service switch.

BACKGROUND OF THE INVENTION

Service switches are known which are connected by wires and which interrupt or open the voltage supply to a load. Likewise known from DE 10063305 C1 is the possibility, in principle, of realizing energy-autonomous radio switches which draw their energy from the actuation of the switch. The force and the speed of the actuation is in this case always different and thus likewise results in quantities of energy yield which are always different. This is of particular importance when electronic circuits for generating a radio signal to be transmitted are dependent on this energy supply.

Applications are desired in which, for esthetic or functional reasons, a wireless switch is required which is the same, or is at least very similar, in shape and outer appearance as a service switch.

SUMMARY OF THE INVENTION

One object of the invention is to provide an energy-autonomous wireless switch, in which the energy supply for a wireless electronic system is independent of the actuating force and the actuating path, and which is suitable for known service switch designs, and is capable of performing more than one switching function.

This and other objects are attained in accordance with one aspect of the present invention directed to an energy-autonomous electromechanical wireless switch or radio pushbutton having at least one rocker switch, at least one transducer element for converting mechanical to electrical energy, at least one dead-center mechanism, at least one electronic system which is electrically connected to the transducer element for generating and emitting a wireless signal, at least one actuating panel, having at least one sensor per actuating panel, and at least one mechanism for deflecting the force introduced by the rocker switch onto the dead-center mechanism. A mechanical coupling is formed between the rocker switch and the transducer element by means of the dead-center mechanism, and mechanical energy introduced by the rocker switch is stored in the dead-center mechanism until a tipping point is reached, and, once the tipping point has been exceeded, the mechanical energy is transmitted to the transducer element. The force and the speed of the excitation of the transducer element which is thus achieved is determined by the dead-center mechanism, wherein the dead-center mechanism has an upper dead center and a lower dead center, which each form a movement end point of a directed movement of the dead-center mechanism. The tipping point is arranged between the two dead centers, and the dead-center mechanism excites the transducer element in the movement direction of the energy store.

One embodiment of the invention is a combination of an electronic system and a mechanism to form a compact, miniaturized module. The actuation takes place by means of compressive force on one or more actuating panels, the mechanical force being deflected by levers or the like and thus being passed on to the transducer element. An actuation, of each actuating panel, has an effect on the transducer element such that sufficient energy is provided for operating the electronic system for a short period of time and for generating and emitting a wireless signal. The transducer element can be a piezoelectric transducer mounted on a flat spring. Electrodynamic or magnetostrictive transducers and combinations of two or more transducers having different physical principles are also suitable.

A dead-center mechanism is provided which, up to a tipping point, absorbs or stores the mechanical energy introduced via the actuating panels and then, beyond this tipping point, releases this mechanical energy in the direction of the next dead center, for example by means of spring force, and thus actuates the transducer. This means that, on the action of force, initially energy is collected in a mechanical store, preferably one or more springs, and this energy is transferred rapidly and independently of the speed of the actuation and likewise independently of the force of the actuation to the transducer element when the tipping point is exceeded. In this manner, the same quantity of energy is always converted irrespective of the type of actuation of the actuating panel.

According to an embodiment of the invention, each actuating panel has an associated sensor, which only responds on actuation of this actuating panel. This sensor can be an electromechanical contact, in the form of a flexible, conductive mat, whose conductive parts when actuated bridge over conductor tracks on a printed circuit board. Other types of switch, such as micro pushbuttons, miniature light barriers or reed contacts, are also possible as sensors.

The electronic system which is supplied with energy via the transducer element uses the respective sensor to register the actuating panel which was used to generate the energy, and encodes this information in addition to a unique identifier for the switch and the switching direction of the actuating panel in a wireless signal.

Each actuating panel, which may be in the form of, for example, a rocker button, a rocker switch or a touch panel, excites the mechanism such that both pressing and releasing the actuating panel excites the transducer element and thus provides energy to the electronic system, and thus likewise a wireless signal is produced. Accordingly, the wireless signal contains not only information for identifying the switch and the actuated actuating panel, but also contains information on the direction of the actuation of the actuating panel. The transducer element creates voltage with a polarity that depends on the direction of actuation. One possibility for detecting the direction of actuation is an evaluation of the polarity of the voltage provided to the electronic system by the transducer element. The wireless signal thus contains, for example, in a list which is not exclusive, the following information:

1. An identification number for the wireless switch.
2. An identifier for the actuating panel.
3. Information on the direction of actuation.

BRIEF DESCRIPTION OF THE DRAWINGS

FIG. 1 shows a perspective illustration of an embodiment of the wireless switch, FIG. 2 shows a sectional illustration of an embodiment of the wireless switch.

DETAILED DESCRIPTION OF THE DRAWINGS

Figure 3:
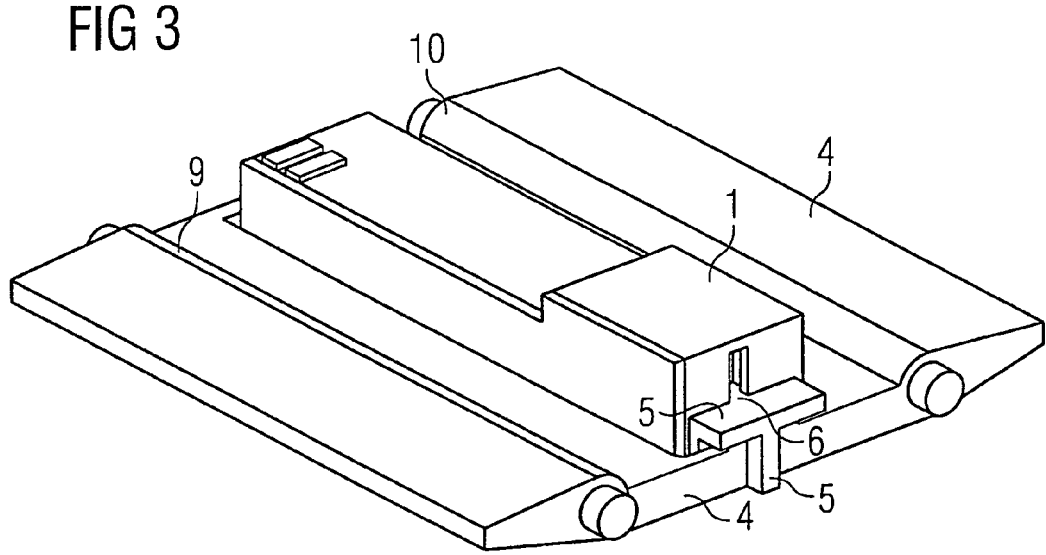
FIG. 3 shows a perspective illustration of the mechanical components for force transmission.

FIG. 1 illustrates a service switch according to the invention in an embodiment having two actuating panels 2 which are surrounded by a frame 8. This exemplary embodiment corresponds in shape and design to a service switch.

FIG. 2 shows a sectional illustration of the same exemplary embodiment, the section being taken in the longitudinal direction through one of the actuating panels 2. In this embodiment, the actuating panels 2 are in the form of rocker switches, which are illustrated here in their rest position and centrally positioned. The actuating panel 2 has direct mechanical contact to the mechanism 4 and direct contact to the sensors 3. If the rocker is actuated on one side, at the same time the mechanism 4 and the sensor 3 are thus actuated or triggered.

The perspective illustration in FIG. 3, which shows exclusively the mechanism 4 for deflecting the force onto the transducer element 1, illustrates the operation of this mechanism 4. The exemplary embodiment illustrated has a transducer element 1, which is arranged centrally in the mechanism 4. Said mechanism has two rotatingly mounted levers 9 and 10, which are each moved by a movement or actuation of the actuating panel. One of the levers 9 and 10, depending on which way actuating panel 2 is rocked, pushes the driver 5 upward when the actuating panel 2 is pressed and allow driver 5 to recede again when the actuating panel is released.

Owing to the arrangement of the levers on both sides, the driver 5 is moved in each actuating direction of the actuating panels 2. Since the driver 5 contributes to the excitation of the transducer element 1 via a dead-center mechanism 6, with each actuation of the actuating panel 2, the energy supply to an electronic system 7 is ensured.

Figure 4:
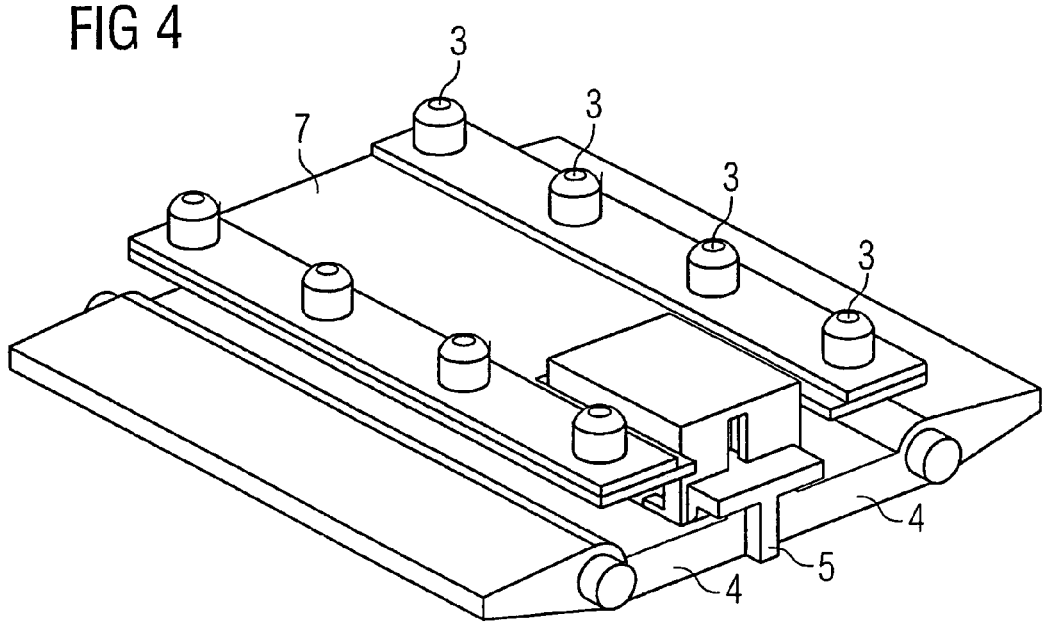
FIG. 4 shows the components shown in FIG. 3 with electronic components.

FIG. 4 shows the just-described mechanism in conjunction with the electronic components. Said electronic components are the electronic system 7 for producing and emitting a wireless signal (such as a system for producing radio signals for example, and integrating information from the sensor into that signal with very low power consumption is well known to anyone with ordinary skill in the art), and the sensors 3 for detecting the actuated actuating panel and possibly for detecting the actuating direction.

An electrical contact between the transducer element 1 and the electronic system 7 is provided for the purpose of supplying a voltage to the electronic system 7.

Figure 5:
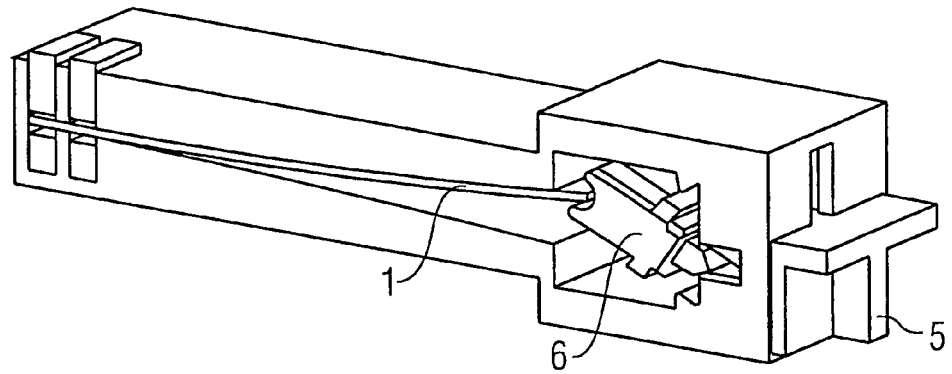
FIG. 5 shows a transducer element having a dead-center mechanism and a driver.
Figure 6:
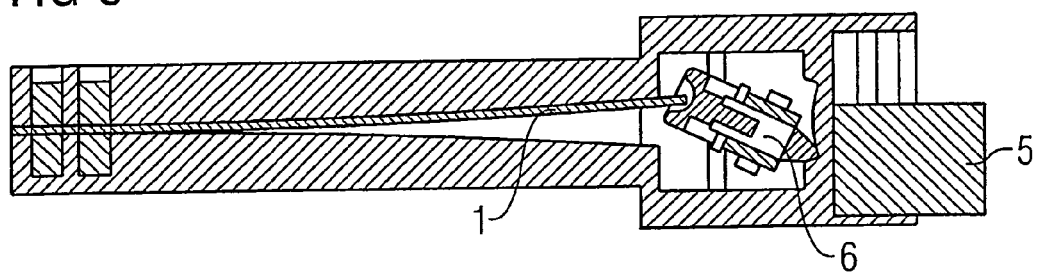
FIG. 6 shows a sectional illustration of the transducer element shown in FIG. 5 with the section being taken vertically along a longitudinally extending center line.
Figure 7:
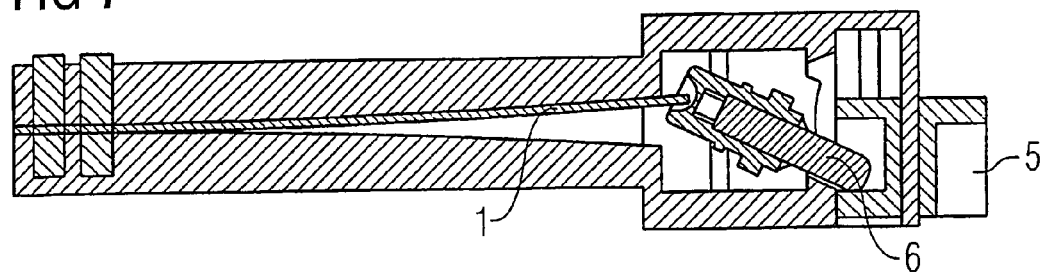
FIG. 7 shows a further sectional illustration of the transducer element of FIG. 5 with the section being displaced to either side of the section shown in FIG. 6.

The perspective illustration in FIG. 5 shows the dead-center mechanism 6 which actuates the transducer element 1. With reference to the preceding Figures, the form of the actuation of the driver 5 has been described. The transmission of the mechanical energy by the driver 5 to the transducer element 1 will now be described with reference to FIGS. 5 to 7.

If the driver 5 is moved, the dead-center mechanism 6 in conjunction with the transducer element 1 and its spring force and possibly further spring elements initially stores this mechanical energy. If the dead-center mechanism 6 reaches a tipping point, there is then an energy output, or release, in the direction of the next dead center and, thus, in a predetermined manner. Irrespective of the speed, duration and force of the causally acting mechanical actuation, energy is transmitted always in the same form and with the same force and duration to the transducer element 1. This ensures that the electrical energy produced by the transducer element 1 is always constant.

The scope of protection of the invention is not limited to the examples given hereinabove. The invention is embodied in each novel characteristic and each combination of characteristics, which includes every combination of any features which are stated in the claims, even if this combination of features is not explicitly stated in the claims.

We claim:

1. An energy-autonomous electromechanical wireless switch or radio pushbutton comprising:

at least one rocker switch, at least one transducer element (1) for converting mechanical energy to electrical energy, at least one dead-center mechanism (6), at least one electronic system (7), which is electrically connected to the transducer element (1), for generating and emitting a wireless signal, at least one actuating panel (2), having at least one sensor (3) per actuating panel (2), and at least one mechanism (4) for deflecting the force introduced by the rocker switch onto the dead-center mechanism, wherein the rocker switch (2) is mechanically coupled to the transducer element (1) by the dead-center mechanism (6), and wherein mechanical energy introduced by the rocker switch (2) is stored in the dead-center mechanism (6) until a tipping point is reached, and, once the tipping point has been exceeded, the stored mechanical energy is transmitted to the transducer element (1), wherein the force and the speed of the excitation of the transducer element (1) which is thus achieved is determined by the dead-center mechanism (6), and wherein the dead-center mechanism (6) has an upper dead center and a lower dead center, with each of said dead centers forming a movement end point of a directed movement of the dead-center mechanism (6), and the tipping point being arranged between said dead centers, and wherein the dead-center mechanism (6) excites the transducer element (1) in the movement direction of the energy store.

2. The energy-autonomous electromechanical wireless switch as claimed in claim 1, wherein a driver (5) transfers a directed movement of the rocker switch to the dead-center mechanism (6) in a targeted manner.

3. The energy-autonomous electromechanical wireless switch as claimed in claim 1,
wherein
the dead-center mechanism (6) excites the transducer element (1) with spring force.

4. The energy-autonomous electromechanical wireless switch as claimed in claim 1,
wherein
the excitation of the transducer element is determined by a spring force of the transducer element (1).

5. The energy-autonomous electromechanical wireless switch as claimed in claim 1,
wherein
the transducer element (1) is a piezoelectric and/or a magnetodynamic and/or a magnetostrictive transducer element.

6. The energy-autonomous electromechanical wireless switch as claimed in claim 1,
wherein
the mechanism (4) has at least one lever (9 or 10), which transfers the work introduced by the actuating panel to a driver (5), which moves the dead-center mechanism.

7. The energy-autonomous electromechanical wireless switch as claimed in claim 1,
wherein
the rocker switch has a rest position in a central position and in each case a first and a second actuating direction starts from this central position.

8. The energy-autonomous electromechanical wireless switch as claimed in claim 1,
wherein
each actuation of the actuating panel (2) is detected by at least one sensor (3), and the actuating direction of the actuating panel (2) is thus detected and is transmitted to the electronic system (7).

9. The energy-autonomous electromechanical wireless switch as claimed in claim 1,
wherein
the electronic system (7) generates an encoded signal using the energy supplied by the transducer element (1) and the detected actuating direction.

10. The energy-autonomous electromechanical wireless switch as claimed in claim 1,
wherein
a uniquely encoded signal is generated for each detected actuating direction.

11. The energy-autonomous electromechanical wireless switch as claimed in claim 1,
wherein
the sensors are switching contacts.

12. The energy-autonomous electromechanical wireless switch as claimed in claim 10,
wherein
the uniquely encoded signal contains, an identifier for the wireless switch and/or the actuating panel and/or the actuating direction.

13. The energy-autonomous electromechanical wireless switch as claimed in claim 11,
wherein said sensors comprise switching mats, micro pushbuttons or electromagnetically or electrostatically actuated switching contacts.

* * * * *